United States Patent [19]
Kurkowski

[11] Patent Number: 5,235,548
[45] Date of Patent: Aug. 10, 1993

[54] MEMORY WITH POWER SUPPLY INTERCEPT IN REDUNDANCY LOGIC

[75] Inventor: Hal Kurkowski, Dallas, Tex.

[73] Assignee: Dallas Semiconductor Corp., Dallas, Tex.

[21] Appl. No.: 554,978

[22] Filed: Jul. 12, 1990

Related U.S. Application Data

[63] Continuation of Ser. No. 337,235, Apr. 13, 1989, abandoned.

[51] Int. Cl.$^5$ .......................... G11C 7/00; G11C 29/00
[52] U.S. Cl. ...................................... 365/200; 365/203; 365/226; 365/227; 371/10.1; 371/10.2; 371/10.3
[58] Field of Search ............... 365/200, 226, 227, 203; 371/10.1, 10.2, 10.3

[56] References Cited

U.S. PATENT DOCUMENTS

| | | | |
|---|---|---|---|
| 4,367,538 | 1/1983 | Shimada | 365/203 |
| 4,417,328 | 11/1983 | Ochii | 365/203 |
| 4,587,639 | 5/1986 | Aoyama et al. | 365/200 |
| 4,603,404 | 7/1986 | Yamauchi et al. | 365/200 |
| 4,635,190 | 1/1987 | Meyer et al. | 365/200 |
| 4,639,895 | 1/1987 | Iwahashi et al. | 365/200 |
| 4,658,379 | 4/1987 | Fujishima et al. | 365/200 |
| 4,733,372 | 3/1988 | Nanbu et al. | 365/200 |
| 4,780,851 | 10/1988 | Kurakami | 365/200 |

Primary Examiner—Joseph L. Dixon
Assistant Examiner—Michael A. Whitfield
Attorney, Agent, or Firm—Worsham, Forsythe, Sampels & Wooldridge

[57] ABSTRACT

A low-power SRAM with redundant rows in each of the subarrays. Conventional redundancy logic permits defective rows to be electrically replaced by redundant rows. In addition, power supply disconnect logic permits the $V_{DD}$ supply voltage line for the bad row to be disconnected.

5 Claims, 4 Drawing Sheets

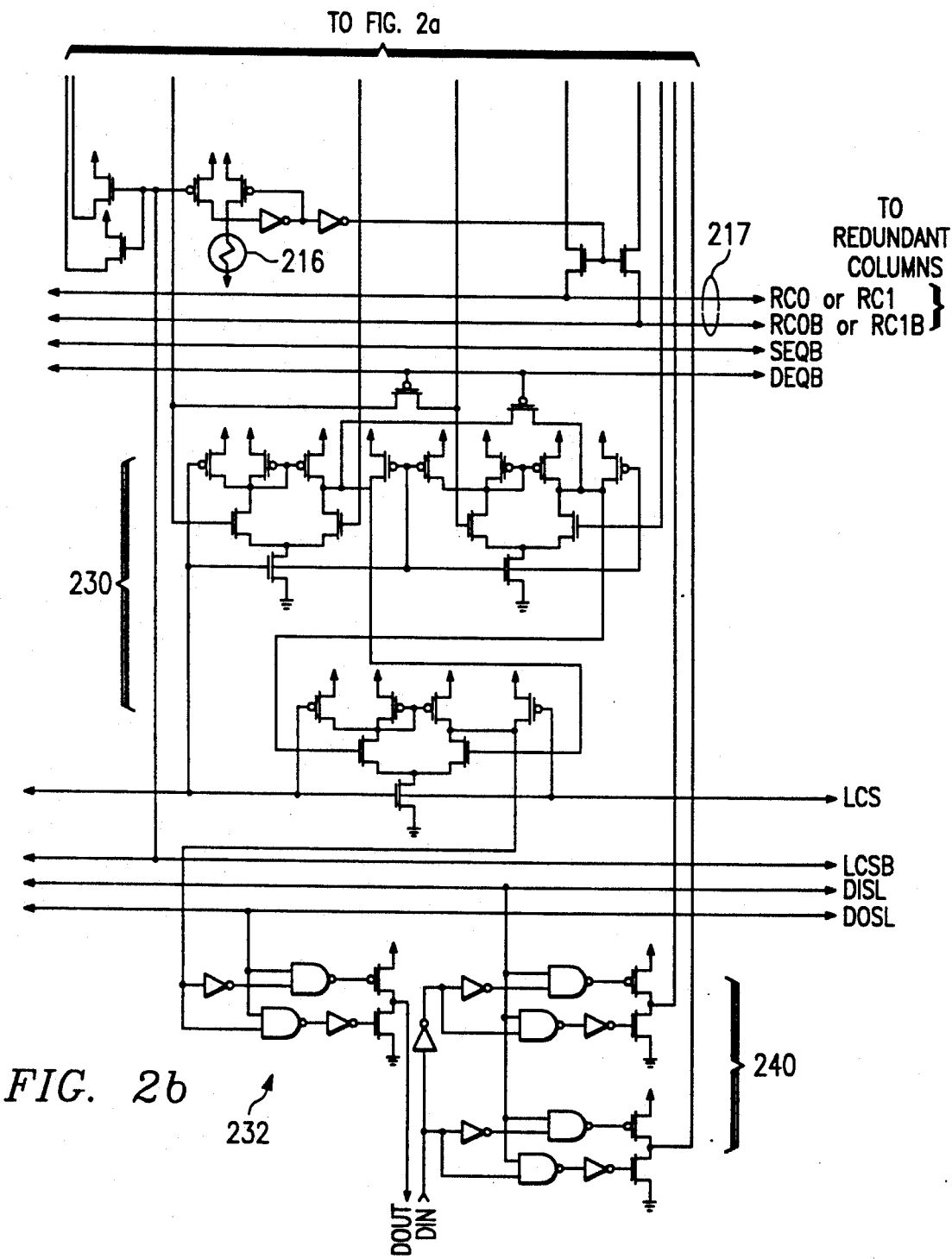

MEMORY WITH POWER SUPPLY INTERCEPT IN REDUNDANCY LOGIC

This is a continuation of application Ser. No. 337,235, filed Apr. 13, 1989, abandoned.

BACKGROUND AND SUMMARY OF THE INVENTION

The present invention relates to integrated circuit memories, and particularly to low-power static random access memories (SRAMs).

POWER EFFICIENCY OF CMOS MEMORY

Conventional CMOS static memories have developed to the point where their standby power consumption is extremely small. The low power consumption of CMOS is extremely advantageous in a wide variety of environments, and is one of the reasons why CMOS logic has become very widely used for a wide variety of digital circuits. Low power consumption is not only advantageous where the total drain on system power supply must be conserved (as, for example, in applications where the power is being supplied from a battery), but also implies that the power dissipation on-chip will be less. This can be important in a wide variety of applications where a very high density is required.

In a conventional CMOS SRAM, six transistors are used in each cell. Four of these transistors form a latch (i.e. a pair of cross-coupled inverters), which has two data nodes with opposite logic states. Each node is connected to ground through an NMOS driver transistor. The driver transistor which connects each node to ground has its gate connected to the opposite data node so that, when one data node goes high, it will pull the opposite data node low by turning on its driver transistor. Similarly, each node is connected, through a PMOS pull-up transistor, to the high supply voltage $V_{DD}$ (which is typically 5 volts). Again, the data nodes are connected to control the pull-up transistors of the opposite data node, so that, when one of the data nodes goes low, it will turn on the pull-up transistor of the opposite node, so that the opposite node is held high. In addition, two pass transistors (normally NMOS transistors) selectively connect the two data nodes to a pair of bit lines. (The gates of the pass transistors are connected to a word line, so that the cell nodes will be connected to the bit line pair only if the word line goes high.) Such a 6-transistor cell will hold its logic state indefinitely (as long as the supply voltages are maintained and no transient upset occurs). Moreover, while such a cell is simply holding data, it has almost zero power consumption, since each of the nodes will be disconnected from one of the two power supply voltages. Thus no current flows, except for the very small currents caused by junction leakage. (Currents do flow when read or write operations are occurring, and therefore the power consumption of an active cell is much higher.)

However, even higher power efficiencies would be useful. Many system designs have begun to make use of the low standby power consumption of CMOS memory, to provide nonvolatile memory by attaching a very small battery. For example, many personal computers contain a battery-backed clock/calendar, which continues to keep time and data information when the computer is switched off. Many portable applications have also begun to use significant amounts of memory. In such applications, battery lifetime is one of the key performance parameters, from the end-user's point of view. If an integrated circuit which is sold for use in such systems turns out to consume more power than specified, so that the system batteries are exhausted early, this could be very unwelcome to the end-user. A further important class of applications is in packaging an integrated circuit, which includes some memory functions, together with a very small battery. The power supplied by the battery is used to preserve the data in memory while the system power supply is turned off. Thus, this arrangement permits the full advantages of nonvolatile memory to be achieved, without incurring the penalties of high-voltage circuitry and slow write time (as in EPROM or EEPROM floating-gate technology).

Thus, by cutting off the excessive leakage of defective cells for a CMOS SRAM, the maximum standby power consumption can be reduced by a substantial factor.

REDUNDANCY

Redundancy is often used in large integrated circuit memories. In such architectures, the memory array is fabricated with additional columns (or rows, or both). For example, a conventional 256K SRAM, without redundancy, might include sixteen subarrays, each of which had two sides, with each side including 128 rows and 64 columns. (Thus, the total number of cells in this example would be $64 \times 128 \times 2 \times 16 = 262,144$.) In such a memory, if one cell in a million (at random) is defective after processing, then 23% ($= 1 - 0.999999^{16384}$) of the memory chips will be defective (disregarding other sources of defects). However, if the chip can be made slightly larger, so that each subarray includes two redundant rows which can be substituted for a bad row, then chips in which no more than two bad rows occur in any one subarray can be repaired. This is done by programming the redundancy logic, at the time of initial testing, to substitute a redundant row for each defective row. In this case, the only wasted chips will be those in which three bad rows occur in one subarray. The chances of this occurring are approximately $$1 - ((1 - 0.999999^{128})^3 (128 \times 127 \times 126/6))^{16},$$

or 0.001% (disregarding other types of defects). The foregoing yield calculation has been simplified, by assuming that all defects are point defects (and are randomly distributed without spatial correlation), and also by ignoring defects outside the memory array. However, this calculation does show the general advantages of redundancy.

The conventional way to use such redundant rows (or columns) is to use fuses (programmed when the memory is tested at the time of manufacturing) to indicate to a block of redundancy logic which rows and columns have been selected for replacement by redundant rows and columns. Therefore, when a read or write access is addressed to a bad row or a bad column, the redundancy control logic will divert the read or write operation, so that the data is read or written into the appropriate location in the redundant row or column which has been selected to replace the defective row or column. Thus, the outside system never sees the remapping performed by the redundancy logic. Of course, the redundancy logic must operate fast enough so that the normal access times are preserved.

POWER SUPPLY INTERCEPT LOGIC

In the present invention, an additional function is also performed, in addition to that normally performed by redundancy logic. The redundancy logic can still be used to disconnect the word line of a defective row (as is conventional); and, additionally, power supply intercept logic is also provided. This power supply intercept logic permits the $V_{DD}$ supply voltage line for the bad row to be disconnected. This is advantageous in low-power memory applications, since it means that excess power consumption due to processing defects is avoided.

Present CMOS technology normally does not disconnect the power supply from defective cells. Therefore, cells which have defects which cause excessive leakage current may significantly degrade the standby power consumption of the chip, even if the chip is still fully functional.

BRIEF DESCRIPTION OF THE DRAWING

The present invention will be described with reference to the accompanying drawings, which show important sample embodiments of the invention and which are incorporated in the specification hereof by reference, wherein:

FIGS. 2a and 2b show the organization of a portion of a single read/write block 120, in the presently preferred embodiment.

DESCRIPTION OF THE PREFERRED EMBODIMENTS

The numerous innovative teachings of the present application will be described with particular reference to the presently preferred embodiment, wherein these innovative teachings are advantageously applied to the particular problems of low-power CMOS technology, and particularly to a low-power 256K SRAM. However, it should be understood that this embodiment is only one example of the many advantageous uses of the innovative teachings herein. In general, statements made in the specification of the present application do not necessarily delimit any of the various claimed inventions. Moreover, some statements may apply to some inventive features but not to others.

Figure 1:
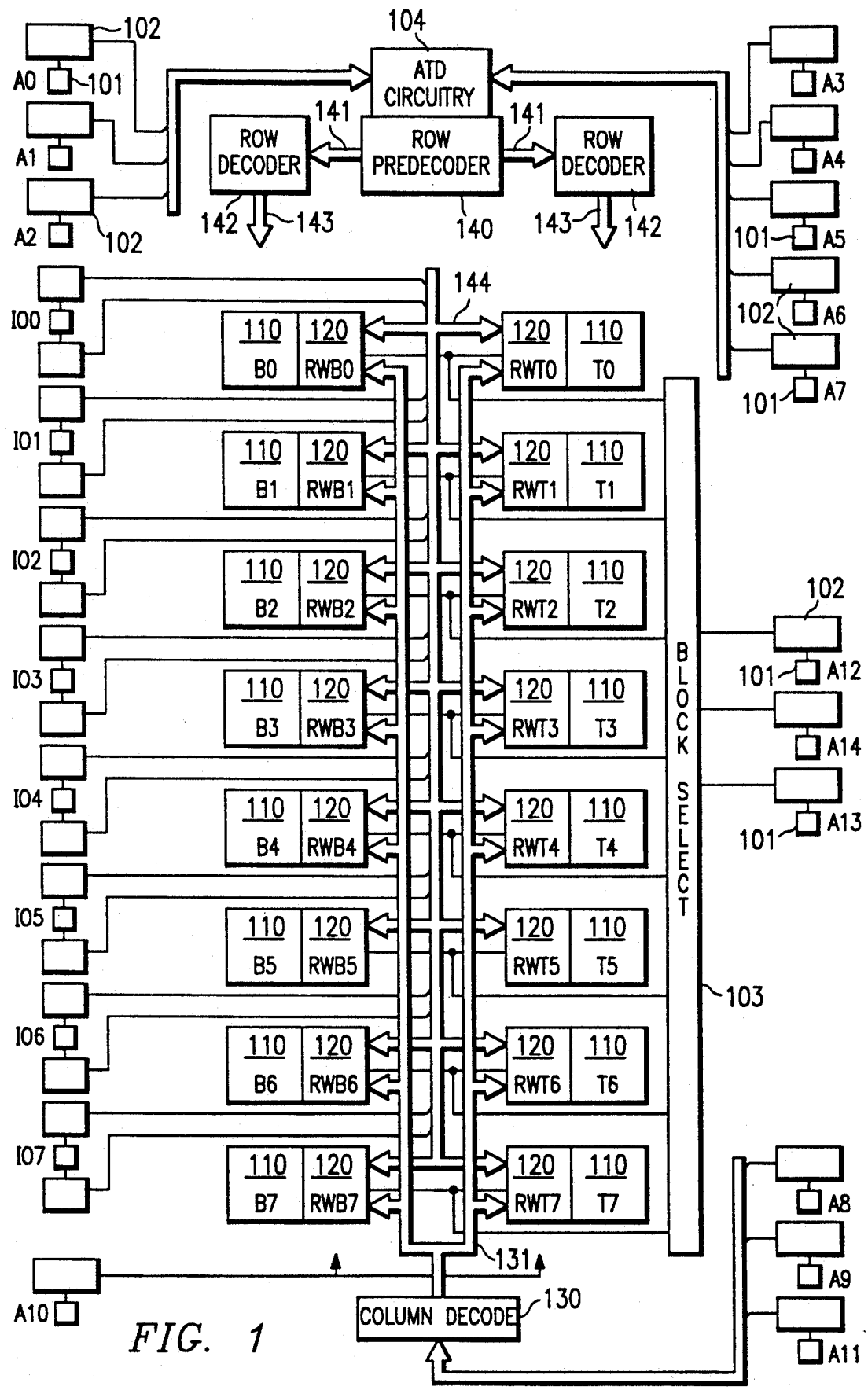
FIG. 1 shows the overall architecture of an SRAM enable by the present invention.

FIG. 1 shows the architecture of the SRAM of the presently preferred embodiment. This sample embodiment is configured as a byte-wide memory (32K×8), and includes sixteen subarrays. Each of the subarrays has four redundant pairs of row lines. Each set of four subarrays also has one redundant column available. After the device is manufactured, it is tested for the locations of rows and columns which contain defective devices. After the memory chip has been scanned for defects, a decision is made as to which redundant rows or columns must be enabled in the memory to replace the defective locations. Of course, in some cases there may be more defects than can be replaced, and in this case the chip is scrapped.

Once a decision has been made as to which of the rows or columns in each of the blocks should be replaced by a redundant row or column, fuses are blown to encode this information permanently on the chip. (These functions are all performed when the chip is being probed, before it is packaged.)

The redundancy select logic receives signals determined by the state of the blown fuses, and these indicate to the redundancy logic which rows and columns have been selected for replacement by redundant rows and columns. Therefore, when a read access is addressed to a bad row or a bad column, the redundancy control logic will divert the read or write operation, so that the data is read or written into the appropriate location in the redundant row or column which has been selected to replace the defective row or column. Thus, the outside system never sees the remapping performed by the redundancy logic. Of course, the redundancy logic must operate fast enough so that the normal access times are preserved.

In the novel SRAM architecture which will now be described, an additional yield-enhancing function is added, in addition to the normal redundancy select logic. This function is performed by power-supply disconnect logic, which disconnects defective rows of cells from the positive power supply. This additional function is highly advantageous in battery-backed nonvolatile CMOS memories, where standby power consumption is a very critical parameter. The memory should preferably be able to maintain its data for years on the power of single, very small lithium battery. (For example, a complete module, including memory and possibly other functions, may need to function reliably for at least ten years while using less than 2000 Joules of energy at 3 Volts.) Thus, leakage current in such memories is extremely critical. For such applications, even slightly excessive leakage current, which would be perfectly acceptable for most applications, can be enough to disqualify the device. Therefore, in programming the selection of redundant rows and columns, excess leakage is one of the factors which must be considered.

One of the innovative teachings of the present application is that the devices in the memory array are tested for excess leakage current, in addition to other testable parameters, and rows or columns which show excess leakage current are disabled, and replaced by redundant rows or columns. However, it is not as simple to stop leakage current in a bad row as it is to stop data access. Bad cells can still contribute to leakage current, as long as they are connected to power supply and ground, even if their word lines are never driven high and their bit lines are never precharged.

The present invention provides a novel integrated circuit memory, wherein one of the power supply voltage is routed so that the power supply connection to a bad row (or column) of cells can be disconnected by power supply intercept logic. Thus, bad cells cannot contribute to leakage current, since they never see the voltage drop from the power supply voltage to ground.

In the redundancy select logic, the nonvolatile information corresponding to bad rows and columns is stored conventionally, by blowing fuses. The power supply intercept logic contains additional fuses, which are blown to disconnect bad rows of cells from the power supply. (Normally, the set of rows disconnected from the power supply, and the set of rows replaced by the redundancy select logic, would be the same.)

In the presently preferred embodiment, the $V_{DD}$ supply lines are routed through the array of memory cells in diffusions which parallel the rows of cells. In this sample embodiment, one $V_{DD}$ supply line is used for every two rows of cells, so that pairs of rows must be disconnected by the redundancy select logic. (Accordingly, the redundant replacement rows are provided in pairs. Eight redundant rows are available to replace up to four pairs of bad rows.) The presently preferred embodiment also provides some redundant column capability (one redundant column for every 32 columns of data); but the memory cells in a bad column cannot all be disconnected from the power supply. (However, the peripheral pull-up devices associated with the bad column can be disconnected.)

Since the substrate is, in this embodiment, generally held to ground potential inside the array, disconnecting the ground ($V_{SS}$) voltage supply would not be nearly as advantageous, since the leakage path from $V_{DD}$ to ground might still exist. Moreover, disconnecting the ground supply, even in bad parts of the array, would risk creating floating nodes and unexpected junction potentials, which might degrade the operation of adjacent good memory cells.

FIG. 1 shows the overall organization of the memory of the presently preferred embodiment. Sixteen subarrays 110 are each configured as a 2K×8 memory: each subarray contains 2K bytes (16K bits) of data. These subarrays are numbered T0-T7 and B0-B7. The memory cells in each subarray are laid out in 256 rows and 64 columns (plus 8 redundant rows and two redundant columns).

Fifteen address inputs A0-A14 (at respective address input pads 101, with respective buffers 102) permit one of 32,768 (32K) bytes to be selected. Bits A0-A7 select one of the 256 rows in each subarray 110. Bits A8, A9, and A11 are connected to column decode logic 130, which provides eight decoded output lines 131 accordingly. (These lines will select one set of eight columns, of the 64 total columns in each subarray 110. Each subarray contains 64 data columns: the first 8 data columns hold data for the first bit position of the data byte, the next 8 columns hold data for the next bit position, and so forth.) Bit A10 selects one of the two groups of subarrays 110 (either the top row or the bottom row). Bits A12-A14 are connected to block select logic 103, which selects one of the 8 subarrays on each half of the chip.

Eight data pins IO0-IO7 each have two buffers 102 per pad 101, to provide bidirectional buffering. The data lines 144 thus include eight read data lines, and also eight write data lines. The DOUT and DIN lines in each portion of the peripheral logic of the subarrays (shown in FIG. 2b) are connected to one of the eight pairs of data lines 144.

The chip also receives three control signals: a complemented write enable signal WE*, a complemented output enable signal OE*, and a complemented chip select signal CS*. When control signal WE* is low, it indicates that the data on I/O lines IO0-IO7 is to be written into the memory cells. When control signal OE* is low (while WE* is high), it indicates that the byte of data which has been read out from the cells at the selected address (i.e. at the address indicated by bits A0-A14) may be written out onto lines IO0-IO7. When control signal CS* is high, the chip is inactive. (To avoid crowding, the contact pads and buffers for these signals are not separately shown in FIG. 1.)

When a transition occurs on the address input pads 101, the address transition detector 104 detects this, and generates internal timing signals accordingly. (For clarity, the address transition detector 104 is shown connected only to address pins A0-A7, although in fact it is connected to other address pins too.)

In a read operation (when chip enable signal CS* is low and WE* is high), the data from the selected byte will be read out onto input/output lines IO0-IO7. In write mode (when chip enable signal CS* is low and WE* is low), the data from the selected byte will be read in from the input/output lines IO0-IO7.

The eight bits A0-A7, which indicate the row address, are partially decoded by row address pre-decoder 140. This decodes the row address bits by subgroups: three bits are decoded onto eight intermediate lines, three other bits are decoded onto eight more intermediate lines, and two more bits are decoded onto four more intermediate lines. These 20 intermediate lines 141 are then fully decoded, into 256 row lines 143, by each of the two row decoders 142.

One set of these 256 decoded row lines 143 runs right across the chip, from subarray T0 to subarray T7. (Another set of 256 decoded row lines 143 runs across the bottom-half subarrays from B0 to B7.) However, if these row lines were each loaded by all of the 528 columns in the 8 subarrays, they would be unacceptably slow. Therefore, subarray selection logic at each subarray (not shown) permits these "broadcast" row lines 143 to be connected to the row lines of any one subarray only when that subarray has been selected.

In the actual layout of the preferred embodiment, the subarrays 110 on each side are approximately contiguous. However, a small gap is provided between the fourth and fifth subarrays of the eight on each side. This gap is used for wordline segment selection gates, and for buss routing.

Figure 2A:
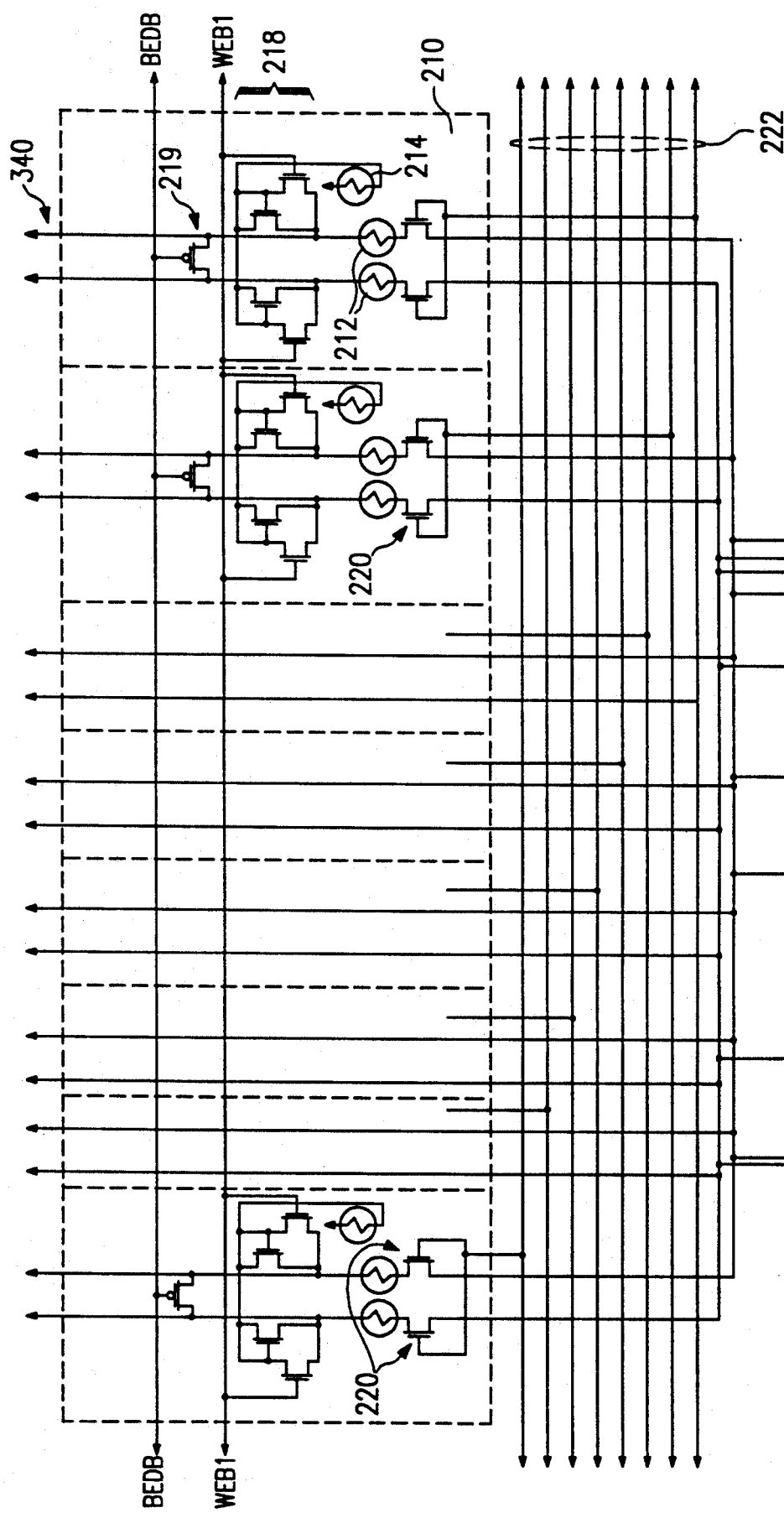

FIGS. 2a and 2b show the organization of a portion of a single read/write block 120, in the presently preferred embodiment. Eight column pull-up/decode blocks 210 are shown. (There is one block 210 for each column, or a total of 64 such blocks in each subarray 110.)

Each of the column pull-up/decode blocks 210 is connected to a respective bitline pair 340, which runs to all 256+8 cells in the column. Each of the column pull-up/decode blocks 210 also includes a pair of fuses 212, which, if blown, will disconnect the bitline pair for that column. Each of the column pull-up/decode blocks 210 also includes another fuse 214, which disconnects the power supply from the column precharge circuits. (This fuse guards against leakage due to shorts from either of the bitline pair to ground.)

Each block 120 includes another fuse 216, which is blown if any column in the subarray is bad. (Each of the redundant columns is shared by four subarray read/write blocks 120.) Thus, when a newly manufactured part is being tested, one bad column per four subarrays can be repaired, by blowing fuse 214 and fuse pair 212 for that column, and blowing fuse 216 for the subarray which contains the bad column. (If fuse 216 is blown, then a low voltage on line LCSB will cause the sense amplifier 230, or data-in buffer 240, to be connected to lines 217, which run across to the bitlines of the redundant column.)

Each of the column pull-up/decode blocks 210 also includes pull-up and load transistors 218, of which the pull-up transistors are controlled by a clock phase WEB1.

Each of the column pull-up/decode blocks 210 also includes a pair of column-select transistors 220, which will connect the bitline pair through to the sense amplifier 230 (or, in write mode, to the data-input buffer 240) only if the appropriate one of the decoded column-select lines 222 is high. There is one sense amplifier 230 and data-out buffer 232 for every eight columns (i.e. one for each of the eight bit positions in each subarray). The design of sense amplifier 230 is quite conventional, and could be modified in a variety of ways, as will be obvious to those skilled in the art.

Figure 3:
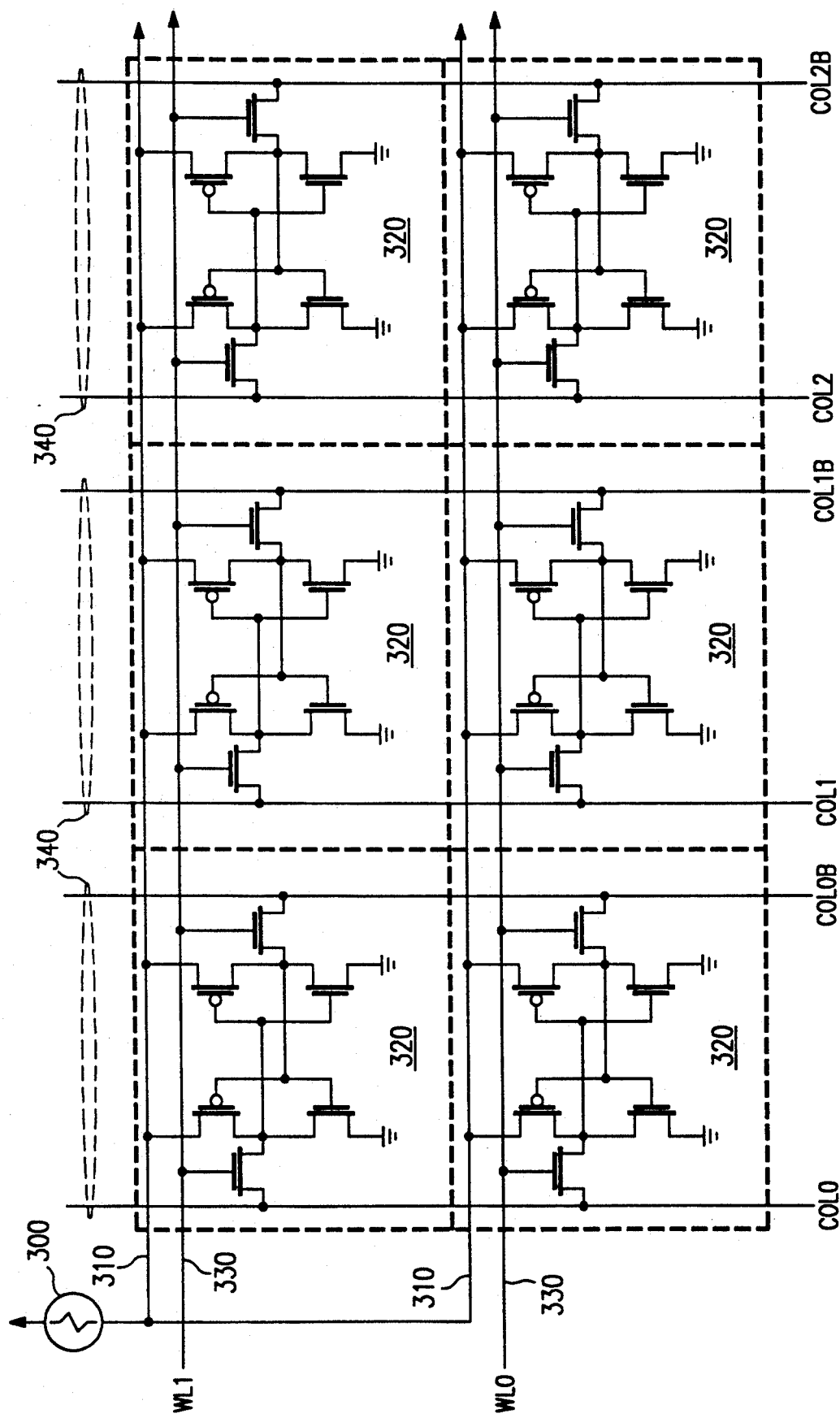
FIG. 3 shows a portion of a single subarray 110, in the presently preferred embodiment.

FIG. 3 shows a portion of a single subarray 110, in the presently preferred embodiment. Six cells 320 are shown (for columns 0, 1, and 2, and rows 0 and 1). The pattern shown is repeated to make up the full array as described. Each cell includes (conventionally) a simple latch, accessed by a pair of pass transistors. The pass transistors for each row are controlled by one of the word lines 330. When the pass transistors in the first row are accessed, the latch nodes of that cell are connected to a bitline pair 340. There is one bitline pair per column. Each bit line pair will be connected to sensing and precharge logic as described above.

Note that the power supply for these two rows is routed through a single fuse 300. This fuse, if blown, will cut off all of the cells in row 0, and all of the cells in row 1, from the on-chip power supply $V_{DD}$. (In the actual layout of the mask levels, row 1 is a mirror image of row 0, so that the row supply line 310 is actually formed as a single conductor which is connected to cells in both rows.)

Thus, blowing this fuse will protect against most types of cell defects in these two rows, including shorts from power supply to ground. (However, this fuse cannot protect against defects in the bit line pairs COL0-/COL0B, etc. A defect in the bit line must be repaired by using one of the redundant columns.)

Of course, if this fuse 300 is blown, one of the redundant row pairs must be programmed in, to provide replacement storage locations. This is done in conventional fashion, by programming the row redundancy logic.

The redundancy address detection circuitry is conventional. For each of the subarrays 110, eight redundant row address generators and two redundant column address generators test each incoming address. Each of these address generators is a simple NOR-type decoder. If none of these address generators detect a match, the peripherals of subarray 110 are permitted to operate normally. However, if a match is detected, array access is disabled, and the corresponding redundant row (or column) is enabled by another output of the redundancy address detection circuitry.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the innovative concepts disclosed could readily be adapted to an architecture which was by-1 rather than by-8. For another example, these concepts could also readily be applied to an architecture which used primarily (or entirely) column redundancy, rather than primarily row redundancy as in the presently preferred embodiment.

In a further alternative, instead of using a fuse to disconnect bad pairs of rows, a static pass transistor could be used for every row (or pair of rows). (This pass transistor would preferably be PMOS, and would be controlled by a static signal derived from fuses or other nonvolatile memory elements.)

It is also not necessary to provide for disconnecting the rows in pairs. This feature is advantageous in high-density memories, since it minimizes the routing requirements, but is not strictly necessary. Similarly, if a column disconnect is used instead of the row disconnect, the power supply routing could be arranged to disconnect the columns individually if desired.

In a further alternative, instead of using one fuse per pair of rows, static signals could be used to control a static pass transistor (preferably PMOS) for every row (or pair of rows).

As will be recognized by those skilled in the art, the innovative concepts described in the present application can be modified and varied over a tremendous range of applications, and accordingly their scope is not limited except by the allowed claims.

What is claimed is:

1. An integrated circuit memory, comprising:
   at least one subarray of memory cells arranged in rows and columns, said rows each having at least one respective wordline running therealong and said columns each having at least one respective bitline running therealong, said subarray also comprising redundant rows of memory cells, said redundant rows being arranged in an extension of said rows of said subarray, said memory also comprising at least one redundant column of memory cells;
   row decoder logic, connected to receive and decode a plurality of incoming address bits and to address one of said word lines correspondingly;
   a plurality of column pull-up circuits, each connected to selectably pull up the potential of a respective one of said bitlines;
   redundancy logic, comprising:
      a set of nonvolatile storage elements, encoding row and column addresses, if any, at which defective ones of said memory cells have been programmed for replacement;
      redundant address decode logic, connected to receive at least a portion of an incoming address signal, and to compare said portion with said addresses in said nonvolatile elements, and conditionally, depending on said comparison, to access one of said memory cells in said redundant rows or columns, at an address therein which partially corresponds to the incoming address signal;
   cell power supply intercept logic, comprising multiple nonvolatile gates which are each operatively connected, between a power supply voltage and rows of cells in said subarray, to selectably disconnect said power supply voltage from respective rows of said subarray; and
   column-peripheral power supply intercept logic, comprising multiple nonvolatile gates which are each operatively connected, between said power supply voltage and a respective one of said column pull-up circuits, to selectably disconnect said power supply voltage from the respective column of said subarray which is connected to said respective one of said pull-up circuits;

whereby said cell power supply intercept logic and said column-peripheral power supply intercept logic can be programmed to prevent leakage current through possible defective elements in ones of said rows or in ones of said columns of said subarray.

2. The integrated circuit of claim 1, wherein each said subarray consists essentially of an SRAM subarray.

3. The integrated circuit of claim 1, wherein said memory cells consist respectively of a latch with pass transistors.

4. The integrated circuit of claim 1, wherein rows and columns of each said subarray can be replaced with redundant rows and redundant columns respectively.

5. The integrated circuit of claim 1, wherein said cell power supply intercept logic is programmed to disconnect the same portions of said subarray which said address decode logic is programmed to replace.

* * * * *